United States Patent [19]

Ouchi et al.

[11] Patent Number: 5,349,598
[45] Date of Patent: Sep. 20, 1994

[54] OPTICAL SEMICONDUCTOR APPARATUS, A METHOD OF DRIVING THE SAME AND AN OPTICAL TRANSMISSION SYSTEM USING THE SAME

[75] Inventors: Toshihiko Ouchi, Machida; Hajime Sakata, Atsugi, both of Japan

[73] Assignee: Canon Kabushiki Kaisha, Tokyo, Japan

[21] Appl. No.: 11,211

[22] Filed: Jan. 29, 1993

[30] Foreign Application Priority Data

Feb. 6, 1992 [JP] Japan .................. 4-056385

[51] Int. Cl.$^5$ .............................................. H01S 3/19
[52] U.S. Cl. .......................... 372/50; 372/26; 372/45
[58] Field of Search ............... 372/50, 20, 45, 26, 372/96

[56] References Cited

U.S. PATENT DOCUMENTS

| | | | |
|---|---|---|---|
| 3,902,133 | 8/1975 | Watts | 331/94.5 |
| 4,837,526 | 6/1989 | Suzuki et al. | 332/7.51 |
| 5,220,573 | 6/1993 | Sakata et al. | 372/50 |

FOREIGN PATENT DOCUMENTS 0238082 9/1987 European Pat. Off. .
3715071 11/1987 Fed. Rep. of Germany .

Primary Examiner—James W. Davie
Attorney, Agent, or Firm—Fitzpatrick, Cella, Harper & Scinto

[57] ABSTRACT

An optical semiconductor apparatus includes at least two upper and lower light waveguides. The waveguides are formed in a direction of semiconductor layers layered on a substrate and have a predetermined coupling degree therebetween. At least one semiconductor laser and at least one photodetector are respectively arranged in any one of the light waveguides. A grating may be formed in or in the vicinity of any one of the light waveguides to attain a wavelength-sensitivity in the coupling between the upper and lower light waveguides. The coupling degree may be controlled by a voltage applied to a part of the waveguides. An incident light entering one of the waveguides can be coupled to a local oscillation light emitted from the semiconductor laser to generate a beat signal therebetween. The beat signal can be detected by the photodetector.

22 Claims, 10 Drawing Sheets

OPTICAL SEMICONDUCTOR APPARATUS, A METHOD OF DRIVING THE SAME AND AN OPTICAL TRANSMISSION SYSTEM USING THE SAME

BACKGROUND OF THE INVENTION

1. Field of the Invention

The present invention relates to an optical semiconductor apparatus or device, such as an integrated type coherent detecting apparatus for a coherent optical communication or transmission and the like, a method of driving the optical semiconductor apparatus and an optical transmission or communication system using the optical semiconductor apparatus.

2. Related Background Art

In recent years, research and development of a coherent optical communication system have been extensively advanced because of improved signal-receiving sensitivity, increased signal multiplicity of wavelength division multiplexing system and other technical advantages. One type of receiving method used in the coherent optical communication is an optical heterodyne detection system. The concept of this heterodyne detection system will be briefly described with reference to FIG. 10.

A beat signal created by a signal light and a local light generated by a local oscillator or laser for local oscillation 55 disposed at a signal receiving side is received by a signal receiving device such as a PIN photodiode (PD) 56, and the received signal is demodulated through an amplifier and a low pass filter 58. The oscillation wavelength of the local light needs to be stably deviated from the wavelength of the signal light by a constant value, and therefore, the wavelength or phase of the local light is stabilized by controlling a current injected into the local oscillating laser diode 55 with a controller 57 using the beat signal. Thus, the wavelength or phase difference between the signal light and the local light is stabilized and set to a constant value. This stabilization is called an automatic frequency control (AFC) or a phase-locked loop (PLL).

Presently, a complicated system is constructed, using a plurality of optical components, in order to carry out such optical heterodyne detection. However, it is critical to develop and realize a small coherent receiving device integrated on a common substrate and having improved stability and reliability, in order to improve and put into practice the coherent optical communication technique.

For example, a device has been presented in which a local oscillating laser 101, a three (3) dB coupler 102, and pin photodiodes 103a and 103b are integrated on a common substrate 100 of InP as shown in FIG. 1 (see Electronics Information Communication Academy of Japan IOE 90-3). In this plane waveguide type apparatus, the coupling between an incident signal light a and a light from the distributed feedback type laser 101 is achieved by the three dB coupler 102. Then, the coupled light is split into two and these split beat signals are respectively received by the pin photodiodes 103a and 103b. The two signals are identical with each other, and one is utilized for detection while the other is utilized for the AFC or PLL.

The above-discussed integrated coherent detector, however, has the following disadvantages:

The first disadvantage relates to the fabrication precision of a portion of the three dB coupler 102 and the length of the waveguide. The waveguide is fabricated by photolithography and etching that are conducted after the growth of semiconductor layers on the substrate 100, and the coupling degree or efficiency of the coupler 102 varies due to fluctuation of the fabrication precision of the waveguide. Thus, the yield of a desired coupling degree decreases. Further, as the length of 1 mm to 2 mm is needed as a coupling length of the coupler 102, the entire size of the apparatus increases. In addition, since optical losses in the waveguide increase, the waveguide needs to be formed with a transparent material to a propagated light. As a result, the waveguide should be fabricated with a different material from those of the laser 101 and the photodiodes 103a and 103b. Consequently, the fabrication process becomes complicated, and coupling losses between the waveguide and the laser 101 and the photodiodes 103a and 103b arise.

Second, when a light transmission line is built in a ring type or bus type network that includes a plurality of nodes, a signal transmitter for a repeater is necessary if a signal light is extracted or drawn out from the transmission line all at one node, and therefore, the structure of a signal receiving portion in the node becomes sophisticated. In the case of the above-discussed integrated coherent detection device, one more coupler has to be arranged to guide merely a part of the signal light to the detector, or a laser for signal transmission has to also be integrated to transmit a signal light to the transmission line through the coupler 102. Thus, it is necessary to integrate more elements on the substrate to obtain such a repeater function, and hence the fabrication process becomes complicated.

SUMMARY OF THE INVENTION

It is an object of the present invention to provide an optical semiconductor apparatus, such as an integrated optical detection device and the like, that is suitable to coherent optical detection and so forth, compact in size, has various functions and is easy to fabricate, a method of driving the optical semiconductor apparatus and an optical transmission system in which the optical semiconductor apparatus is used.

According to one aspect of the present invention, a semiconductor optical apparatus comprises at least two upper and lower light waveguides that are formed along a direction of semiconductor layers and have a predetermined coupling degree therebetween. At least one semiconductor laser and at least one photodetector are respectively arranged in any one of the light waveguides.

A grating may be formed around any one of the light waveguides to attain wavelength-sensitivity in the coupling between the upper and lower light waveguides. Such a coupler may be arranged, in which the coupling between the upper and lower light waveguides has the wavelength-sensitivity and this sensitivity is variable. The semiconductor laser may be a single-mode tunable one that may comprise a distributed feedback laser, a distributed Bragg reflection laser or the like. Two semiconductor lasers may be arranged in a parallel manner.

According to another aspect of the present invention, in a method of driving the above-mentioned optical semiconductor apparatus or an optical transmission system using the optical semiconductor apparatus, a light emitted from the semiconductor laser and a light entering from the exterior are coupled with a given coupling degree and a heterodyne detection is performed in the photodetector to detect information carried by the incident light from the exterior.

According to another aspect of the present invention, in a method of driving the above-mentioned optical semiconductor apparatus or an optical transmission system using the same, a light emitted from the semiconductor laser and a light entering from the exterior are coupled with a given coupling degree and a heterodyne detection is performed in the photodetector to detect information carried by the incident light while the oscillation wavelength or phase of the semiconductor laser is stabilized by a signal detected by the photodetector.

According to another aspect of the present invention, in a method of driving the above-mentioned optical semiconductor apparatus or an optical transmission system using the same, a voltage is applied to a part of the light waveguides to change its refractive index and the coupling degree between the waveguides is varied.

According to another aspect of the present invention, in a method of driving the above-mentioned optical semiconductor apparatus or an optical transmission system using the same, a selection wavelength of the coupler whose selection wavelength is changeable is tuned to a value around the wavelength of an incident light solely at a timing at which the associated apparatus performs a signal receiving, and is not tuned thereto at a timing at which the associated apparatus does not perform the receiving.

According to another aspect of the present invention, in a method of driving the above-mentioned optical semiconductor apparatus or an optical transmission system using the same, the semiconductor laser is used as a transmitter at a timing at which the associated apparatus does not perform the receiving.

According to another aspect of the present invention, in a method of driving the above-mentioned optical semiconductor apparatus or an optical transmission system using the same, the coupling degree between the light waveguides is increased, the photodetector conducts a heterodyne detection and the semiconductor laser is modulated based on the signal detected by the photodetector to transmit this signal to the exterior again.

These advantages and others will be more readily understood in connection with the following detailed description of the preferred embodiments in conjunction with the drawings.

DESCRIPTION OF THE PREFERRED EMBODIMENT

Figure 1:
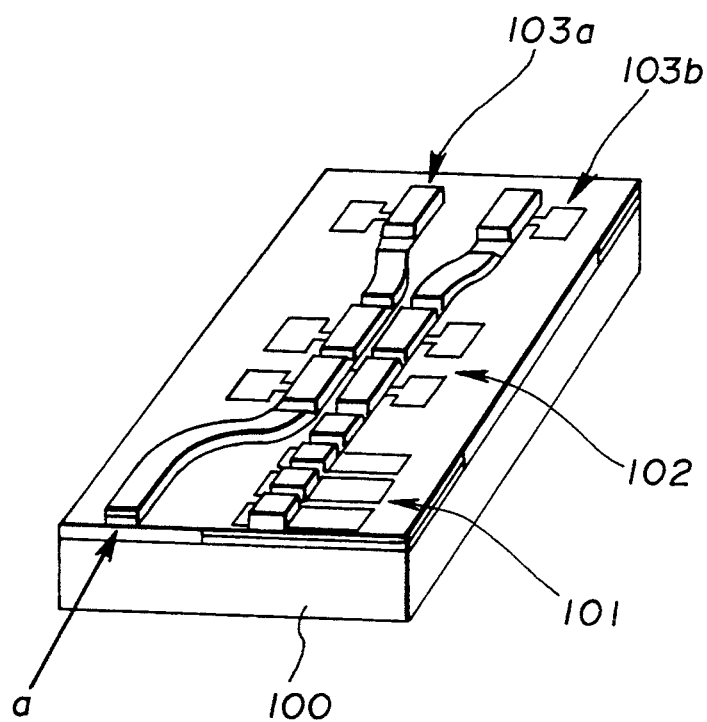
FIG. 1 is a schematic view showing a prior art integrated type optical coherent detection device.
Figure 2:
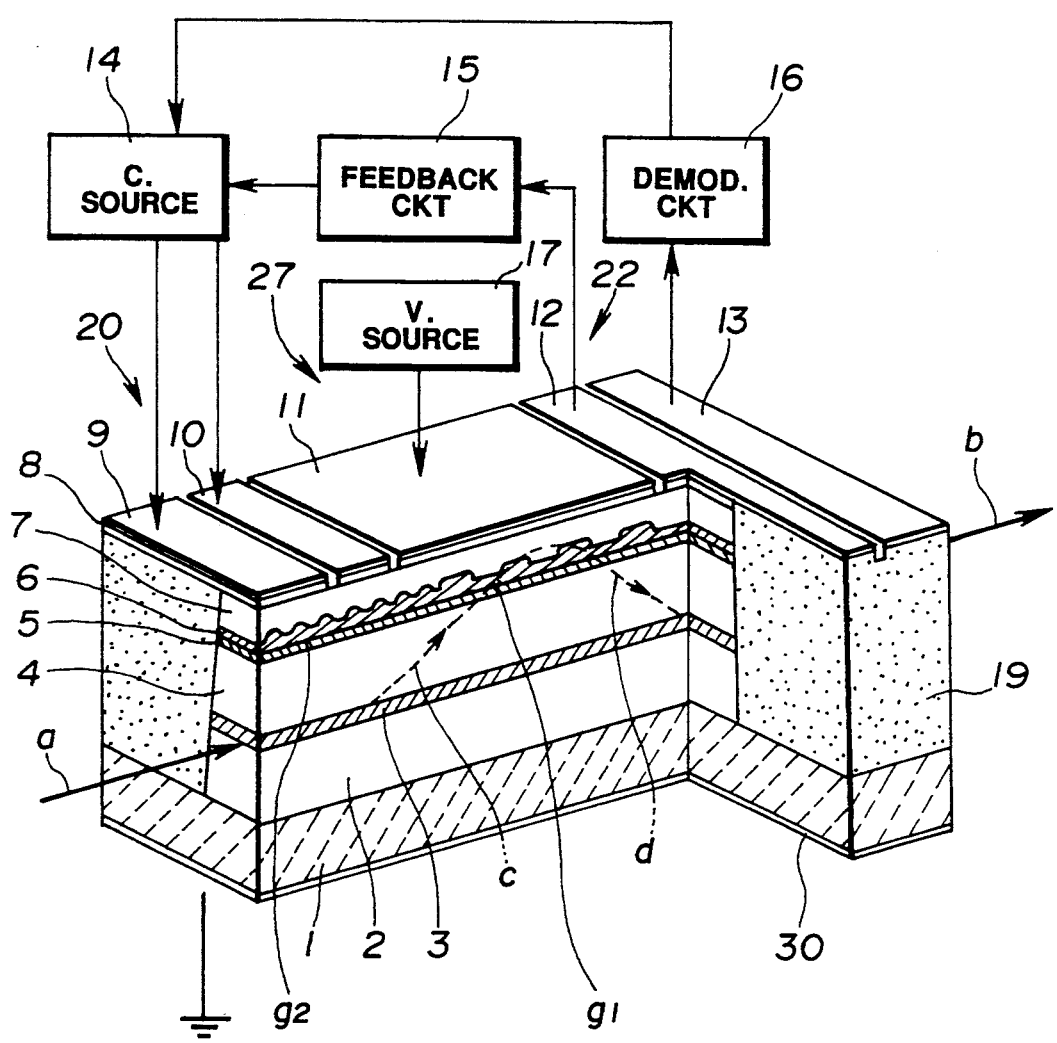
FIG. 2 is a perspective view showing a first embodiment of an optical semiconductor apparatus of the present invention.

A preferred first embodiment of an optical semiconductor apparatus according to the present invention will be described with reference to FIGS. 2 and 3. FIG. 2 shows the structure of the first embodiment, using a cross-sectional perspective view of a cut-away device, and FIG. 3 shows the structure of the first embodiment, using a cross-sectional view taken along a longitudinal direction or a light travelling direction.

The first embodiment is fabricated as follows:

On an n-type GaAs substrate 1, an n-type GaAs buffer layer (not shown) having a thickness of 0.5 $\mu$m, an n-type $Al_{0.5}Ga_{0.5}As$ cladding layer 2 having a thickness of 0.5 $\mu$m, an n-type multiple quantum well (MQW) structure of a lower waveguide 3 consisting of nine (9) sets of n-type GaAs wells (thickness: 30 Å)/$Al_{0.3}Ga_{0.7}As$ barriers (thickness: 80 Å), an n-type $Al_{0.5}Ga_{0.5}As$ cladding layer 4 having a thickness of 1.0 $\mu$m, an MQW structure active layer 5 consisting of three (3) sets of undoped GaAs wells (thickness: 60 Å)/$Al_{0.2}Ga_{0.8}As$ barriers (thickness: 100 Å), a p-type $Al_{0.4}Ga_{0.6}As$ carrier confined layer (not shown) having a thickness of 400 Å and a p-type $Al_{0.2}Ga_{0.8}As$ light guide layer 6 having a thickness of 0.25 $\mu$m are grown in the named order by the molecular beam epitaxy (MBE) method.

Figure 3:
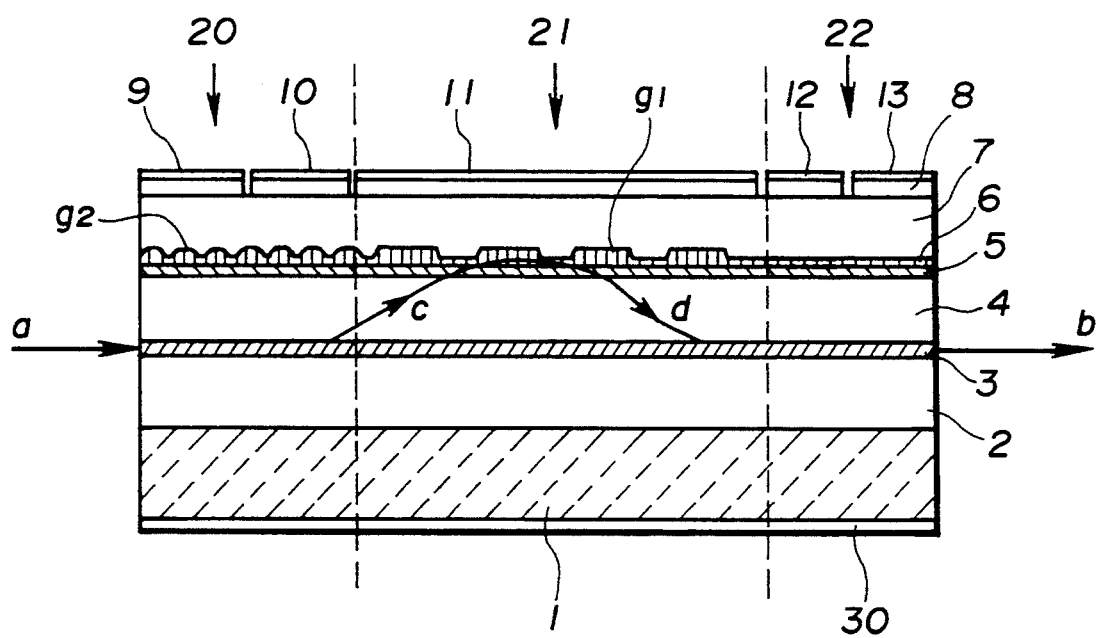
FIG. 3 is a cross-sectional view showing the structure of the first embodiment.

Then, a grating $g_2$, having a pitch or periodicity of 2440 Å and a depth of 1000 Å, is formed in a region of a distributed feedback (DFB) laser portion 20 shown in FIGS. 2 and 3, utilizing a two-beam interference exposure method that uses a He-Cd laser and a reactive ion beam etching (RIBE). Further, a coarse grating $g_1$ having a pitch or periodicity of 10 $\mu$m (a convex portion is 7 $\mu$m and a concave portion 3 $\mu$m) and a depth of 0.1 $\mu$m is formed in a coupling region or portion 21, using photolithography and RIBE. The coupling portion 21 is set to a length of 500 $\mu$m since a light propagated through the lower waveguide 3 fully shifts to the upper waveguide 5 and 6 in the case of 500 $\mu$m. The length of the distributed feedback laser portion 20 is set to 300 $\mu$m. The entire length of a pin photodiode region or portion 22 is set to 200 $\mu$m. Thus, the length of the entire device or apparatus amounts to 1 mm.

After the structure of the light guide layer 6 is fabricated, a p-type $Al_{0.5}Ga_{0.5}As$ cladding layer 7 having a thickness of 1.5 $\mu$m and a p-type GaAs contact layer 8 having a thickness of 0.5 $\mu$m are regrown on the light guide layer 6 by metal organic-chemical vapor deposition (MO-CVD) method. Then, a $SiO_2$ layer is deposited by the magnetron sputter method, and after a stripe of the $SiO_2$ layer having a width of 1.5 $\mu$m is formed, a mesa-etching is performed down to the GaAs substrate 1 by RIBE with a resist on the $SiO_2$ layer as a mask. After the resist is removed, a high-resistance $Al_{0.5}Ga_{0.5}As$ 19 is selectively regrown by using MOCVD with the $SiO_2$ stripe layer as a mask. Thus, the mesa portion is buried as shown in FIG. 2.

After the $SiO_2$ layer is removed, an upper Cr/Au electrode is deposited and electrodes 9 through 13 and the contact layer 8 are respectively separated by at least positions as are illustrated by vertical dotted lines in FIG. 3. After that, the substrate 1 is lapped to a thickness of 100 μm, a lower Au-Ge/Au electrode 30 is deposited and alloying is conducted.

The function of the thus fabricated device will be described. The first embodiment functions as a coherent detection device in a frequency shift keying (FSK) or phase shift keying (PSK) system which includes a light transmission line that works at a frequency of 830 nm. The lower waveguide 3 is transparent to the wavelength of 830 nm, and a signal light a enters the lower waveguide 3 as shown in FIGS. 2 and 3. The signal light gradually couples to the upper waveguide 5 and 6 as indicated by a letter c, due to the grating $g_1$ formed in the coupling portion 21 of the upper waveguide 5 and 6, as the signal light is propagated, and its remaining part is emitted to the exterior as indicated by a letter b. A distributed feedback laser for local oscillation is formed at an upper portion of the DFB laser region 20, and a part of light emitted from this DFB laser travels along the upper waveguide 5 and 6. A beat signal generated between the light from this DFB laser and the signal light is detected by the pin photodiode portion 22. A part of the laser light couples to the lower waveguide 3 as indicated by a letter d, and is emitted as indicated by the letter b. In the pin photodiode portion 22, the electrode is divided into two portions 12 and 13, and one portion 12 is used to supply a feedback signal to the DFB laser portion 20 while the other portion 13 is used to supply a signal for detection. Such function is accomplished by properly controlling a voltage applied to the electrode 11 in the coupling region 21 by a voltage source 17.

The DFB laser of the laser portion 20 oscillates at about 830 nm, and its threshold and spectral line width are respectively 25 mA and 3 MHz. The DFB laser of the laser portion 20 is provided with two divided electrodes 9 and 10, and the oscillation wavelength can be continuously varied over a range of about 10 Å by unevenly injecting currents into those electrodes 9 and 10. One of the electrodes 9 and 10 can be employed for feedback to stabilize the oscillation wavelength.

Figure 4:
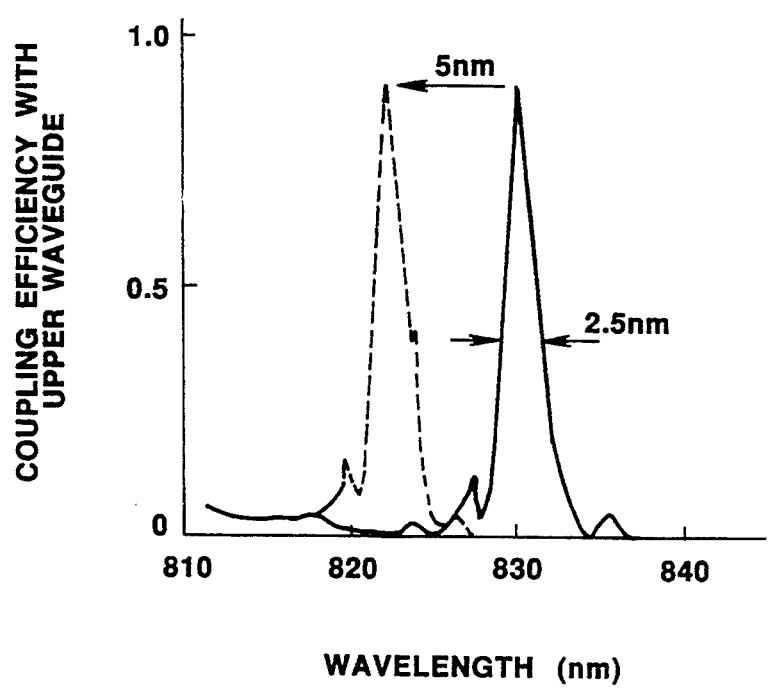
FIG. 4 is a graph illustrating a wavelength dependency of the coupling efficiency at a coupler of the first embodiment.

The coupling region 21 can select the wavelength band to be coupled upward from the lower waveguide 3 by properly setting the grating pitch $g_1$, and in this embodiment, the filtering characteristic of a half value width of 2.5 nm around 830 nm is selected as shown in FIG. 4. The filtering wavelength can be continuously shifted to a shorter value by around 5 nm by applying a voltage through the electrode 11, and thus the coupling degree or efficiency of light with the upper waveguide 5 and 6 can be altered as illustrated in FIG. 4.

The cut-off frequency of the pin photodiode portion 22 is 2.0 GHz at a voltage of 0 V, and 3.2 GHz at a reverse voltage of 5.0 V.

Figure 9:
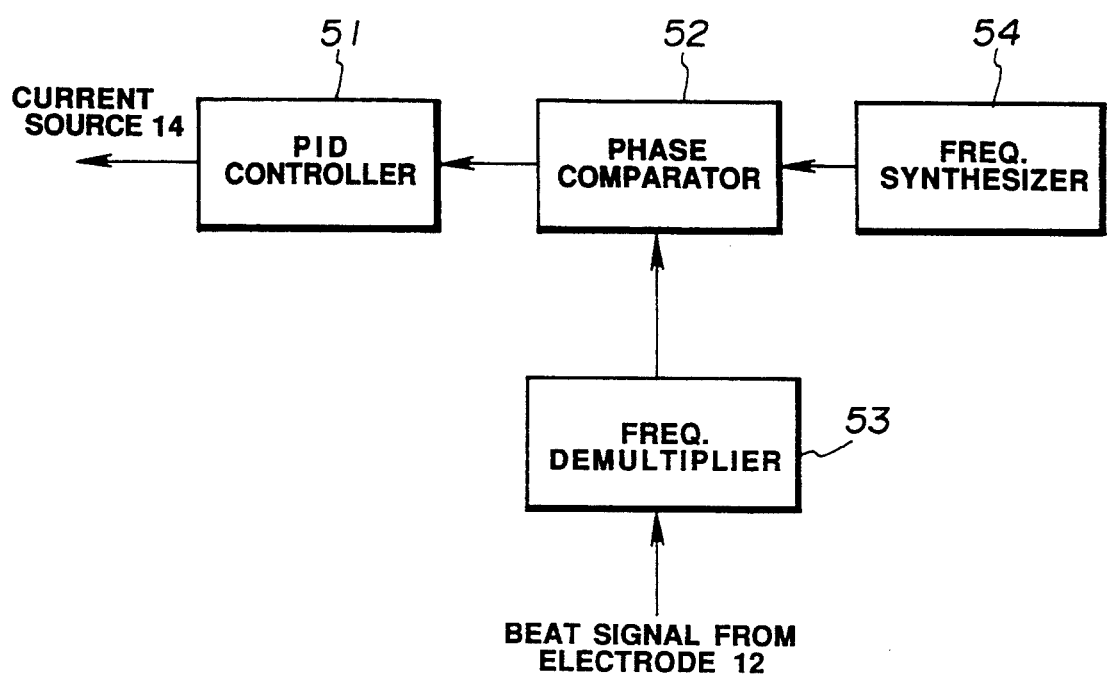
FIG. 9 is a block diagram showing a feedback circuit of a phase-locked loop.
Figure 10:
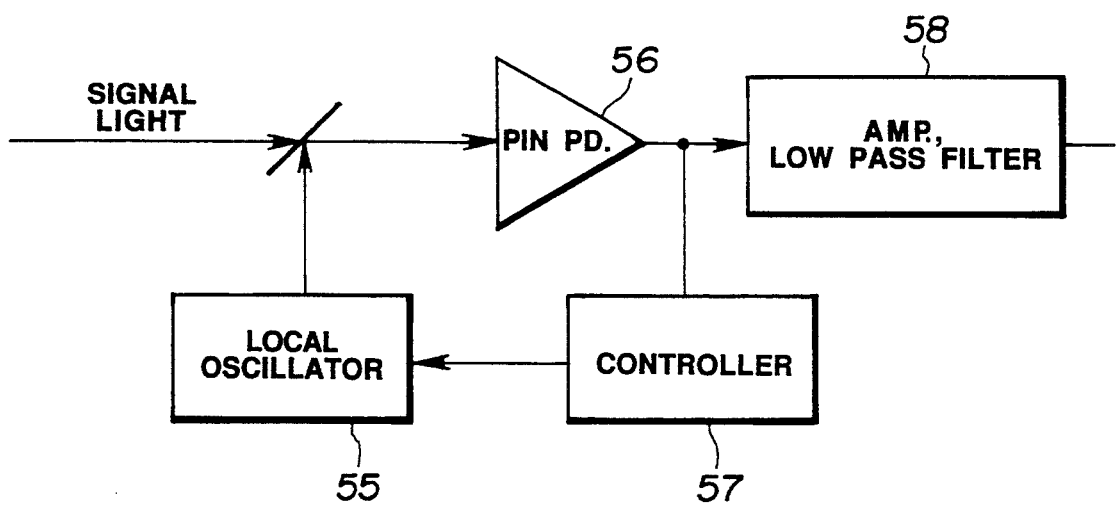
FIG. 10 is a block diagram showing a concept of a coherent optical detection.

A method of driving the above-discussed device will be described with reference to FIG. 2. In FIG. 2, reference numeral 14 designates a constant current source with an external control function which has two channels. One channel is used to supply a constant current to the electrode 9, and the other channel is used to supply to the electrode 10 a current that is composed of a constant current superposed upon a feedback signal, for achieving frequency stabilization of the DFB laser portion 20. The beat signal generated between the laser light and the signal light is received by the pin photodiode portion 22, and the beat signal is picked out by the front electrode 12 thereof. In a feedback circuit 15 into which the signal from the electrode 12 is input, a fluctuation of the beat frequency is converted to a fluctuation of a voltage, and this voltage is fed back to the constant current source 14 to stabilize the oscillation wavelength of the local oscillating laser of the laser portion 20. Thus, AFC is achieved. Or, as shown in FIG. 9, the beat signal from the electrode 12 is frequency-divided by a pre-scaler or frequency demultipler 53, a phase difference between signals from the demultipler 53 and a frequency synthesizer 54 is output from a phase comparator 52, this phase difference signal is fed back to the current source 14 through a proportional plus integral plus derivative (PID) controller 51 and the phase of the laser portion 20 is stabilized. Thus, PLL is accomplished.

Figure 5A:
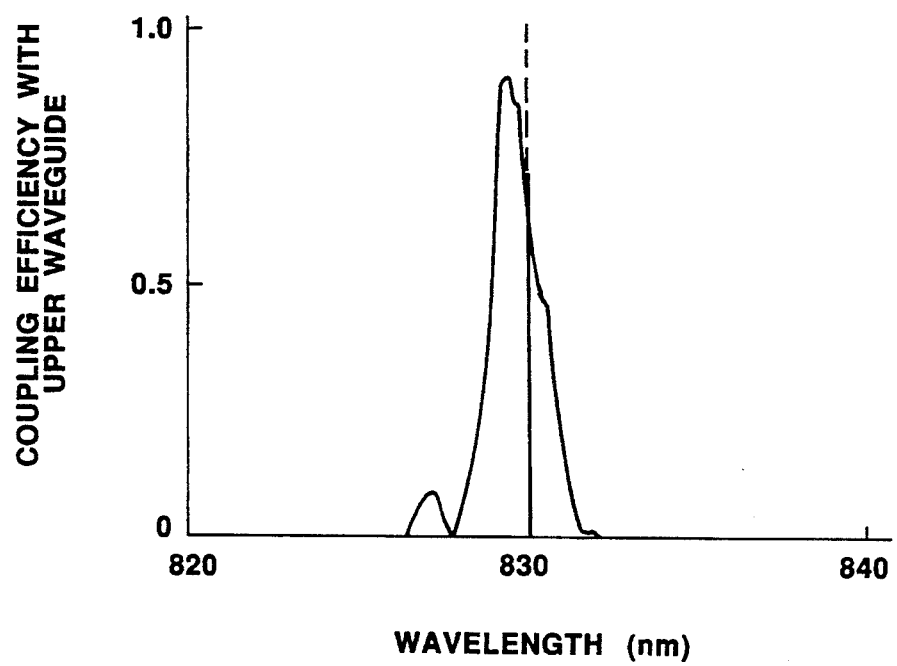
FIGS. 5A and 5B are respectively graphs illustrating wavelength dependencies of the coupling efficiency and the transmissivity.
Figure 5B:
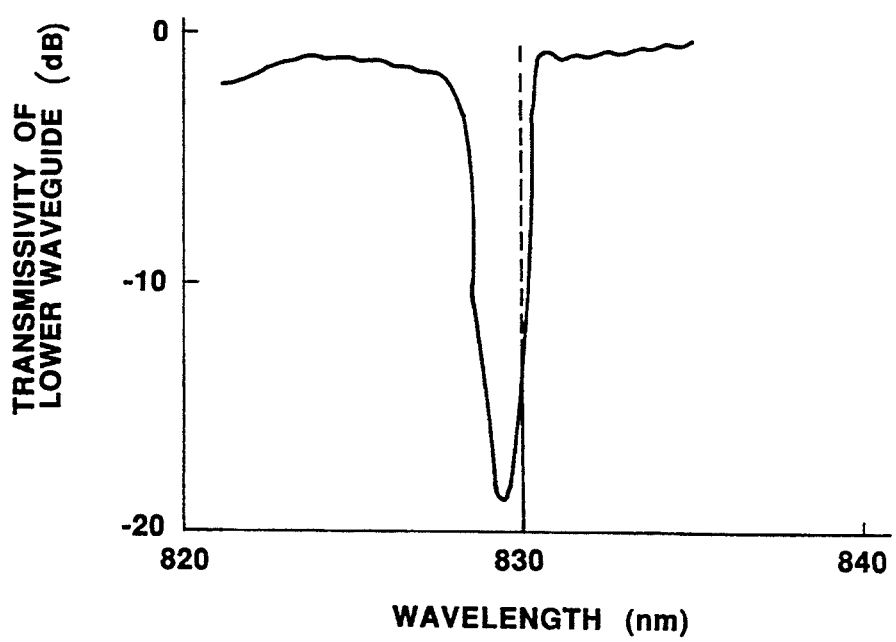

The coupling efficiency at the coupling portion 21 is adjusted by the voltage applied to the electrode 11. Since the local oscillation light from the laser portion 20 is coupled to the lower waveguide 3 and the beat signal is reduced if the coupling efficiency at the coupling portion 21 is too large, the coupling efficiency at the wavelength of 830 nm is adjusted to around 70% as shown in FIGS. 5A and 5B.

Another output from the rear electrode 13 of the pin photodiode portion 22 is used for detecting the signal light by a demodulation circuit 16 through an amplifier and a low pass filter.

The local oscillation light from the DFB laser portion 20 is coupled to the lower waveguide 3 through the coupling portion 21, and if the coupled light remains as it is, the output light b from the lower waveguide 3 is also a beat signal. Therefore, the filtering or coupling wavelength is changed as shown in FIG. 4 by applying a reverse voltage to the electrode 11 of the coupling portion 21 by the voltage source 17, and thus the characteristic of the coupling wavelength shown by dotted lines in FIG. 4 is utilized. More in particular, at the timing at which there is no need to perform the signal receiving by the device, the reverse voltage is applied to decouple or separate the upper and lower waveguides from each other at the wavelength of 830 nm as shown by curved dotted lines in FIG. 4 and the signal light a is caused only to pass through the lower waveguide 3 without any change. Then, the local oscillation light is propagated simply though the upper waveguide 5 and 6, and no influences is given to the signal light by the local oscillation light even if the concerned device is disposed in the light transmission line of an optical communication network. As a result, when the signal is transmitted according to time division multiplexing control, the transmission line of a bus or ring type can be structured solely by this device.

The laser portion 20 for the local oscillation can also be utilized as a signal transmitter. For this purpose, the voltage at the coupling portion 21 is adjusted so that the coupling efficiency between the upper and lower waveguides is controlled to be nearly 100% at the timing at which no signal receiving is needed. At this time, the incident light a is all input into the receiver or photodetector portion 22, while the local oscillation light from the laser region 20 is all coupled to the lower waveguide 3 and emitted outside.

Furthermore, the laser portion 20 for the local oscillation can be used as a repeater. Almost all of the signal light a incident on the incidence end surface of the device is caused to couple to the upper waveguide 5 and 6. The signal detected by the demodulation circuit 16 is fed back to the current source 14, and the laser portion 20 acts as a repeater by modulating the laser in this portion 20 based on this signal. The voltage at the coupling portion 21 is adjusted so that the coupling efficiency at the wavelength of the modulated local oscillation light is set to over 90%, and the modulated light is coupled to the lower waveguide 3 to be transmitted to the light transmission line.

The above-discussed device or apparatus can be applied to the following transmission system:

In this system, a light frequency multiplexing of signals whose transmission speeds are high is effected in a predetermined wavelength band, while a control signal whose transmission speed is low is transmitted, using a single wavelength lying in a wavelength range that is several nanometers apart from the predetermined wavelength band. The signals having high transmission speed are coherently detected using the local oscillation light from the laser portion 20 since they are frequency-multiplexed. On the other hand, the signal of the single wavelength having low speed does not need to be coherently detected. The selection or separation between the above-mentioned two wavelength bands or ranges is achieved by changing the filtering or coupling wavelength as discussed above by controlling the voltage applied to the coupling portion 21. Since the wavelength of the local oscillation light does not need to be tuned to that of the slow-speed light, a magnitude of several nanometers is not required for the changeable wavelength width of the local oscillation light.

The multiplicity of the light frequency multiplexing is determined from the changeable wavelength width of the DFB laser portion 20. Assuming that the frequency interval of the high-speed signals is 10 GHz, the multiplicity amounts to approximately 30 as the center wavelength of an oscillation spectrum of the laser portion 20 can be altered within a width of 10 Å (appro. 300 GHz). The multiplicity is determined also by the wavelength stabilities of wavelength-multiplexed signal lights and the local oscillation light, but the stability of the local oscillation light does not need to be strict when so large multiplicity is not required. In this case, techniques of the above-discussed AFC and PLL and the like can be dispensed with. Further, if the wavelength of the laser portion 20 can be largely changed by changing its temperature, the multiplicity can be further increased.

Second Embodiment

Figure 6:
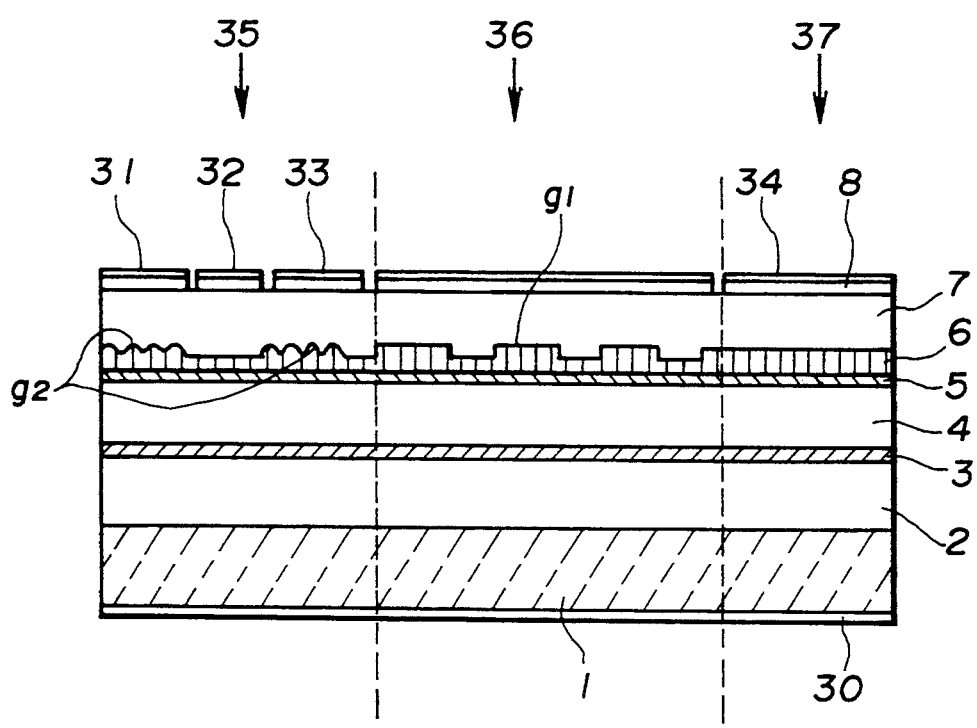
FIG. 6 is a cross-sectional view showing the structure of a second embodiment according to the present invention.

FIG. 6 is a longitudinal cross-sectional view illustrating a second embodiment of the present invention.

In FIG. 6, the structure of a coupling portion 36 is the same as that of the coupling portion 21 of the first embodiment. A local oscillation laser portion 35 is constructed by a three-electrode distributed Bragg reflection (DBR) laser which enables its changeable oscillation wavelength range to widen. The DBR laser is oscillated by injecting a constant current into a central electrode 32 of the laser, and a current superposed on a feedback signal for stabilizing the operation or a modulation signal is injected into electrodes 31 and 33 at both opposite ends of the laser.

The changeable wavelength range can be expanded to approximately 20 Å by such system. The multiplicity of wavelength-multiplexed signals can be increased by widening the changeable wavelength range of the laser portion 35, but if there is no need to increase the multiplicity, AFC or PLL can be dispensed with, as explained in the first embodiment, due to the expansion of the changeable wavelength range. In this case, only one electrode 34 is arranged in a pin photodiode portion 37 as shown in FIG. 6, and thus the detection of a beat signal is conducted solely in the photodiode portion 37. Naturally, the combination of the laser portion 35 or the photodiode portion 37 and the pin photodiode portion 22 or the laser portion 20 shown in FIGS. 2 and 3 of the first embodiment may be adopted. In FIG. 6, the same reference numerals as those in FIGS. 2 and 3 respectively designate portions or elements having the same functions as those in FIGS. 2 and 3.

Third Embodiment

Figure 7:
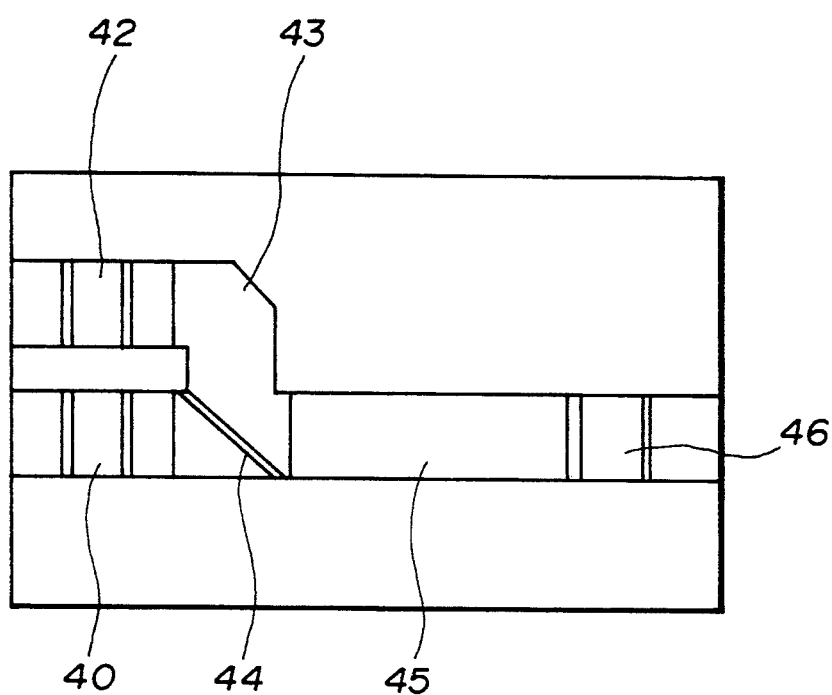
FIG. 7 is a plan view showing the structure of a third embodiment according to the present invention.

FIG. 7 is a plan view of an optical semiconductor apparatus of a third embodiment. Two lasers 40 and 42 for local oscillation are integrated, whose oscillation wavelengths are a little different from each other. The oscillation wavelength of one laser 40 falls within a range from 826 nm to 828 nm, while that of the other laser 42 falls within a range from 828 nm to 830 nm. A light emitted by the laser 42 is caused to enter a coupling portion 45 through a 45° mirror 43 and a 45° half mirror 44. Thus, the wavelength multiplexing of data signals is enabled over a wavelength width of 4 nm or 40 Å, and the multiplicity of data signals can be greatly increased. The coupling efficiency between the lower and upper waveguides at the wavelength of each of respective wavelength-multiplexed signals can be properly adjusted by controlling a voltage applied to the coupling portion 45 through its electrode.

The device of this embodiment can have a function to convert the wavelength of a transmitted light signal. For instance, the signal at a wavelength in the oscillation wavelength band of the laser 42 is received by the PIN photodiode 46, and the laser 40 is modulated in accordance with this received signal.

Fourth Embodiment

Figure 8:
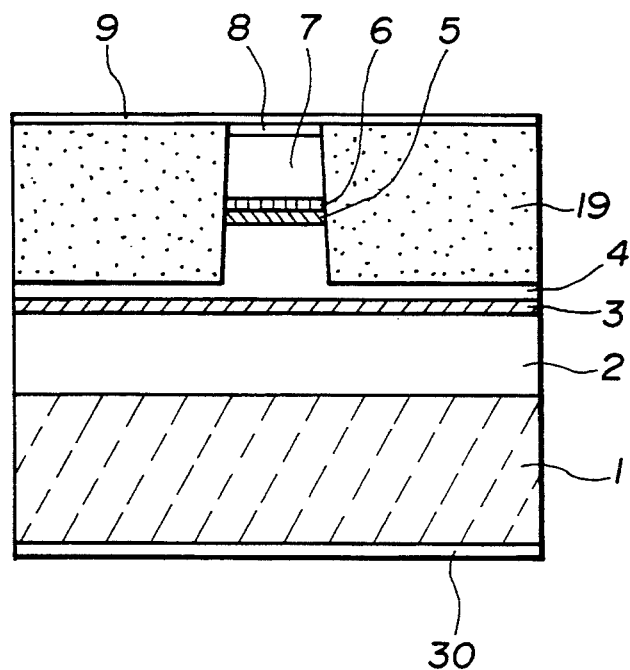
FIG. 8 is a cross-sectional view showing the structure of a fourth embodiment according to the present invention.

FIG. 8 is a lateral cross-sectional view of a fourth embodiment viewed from the light incidence side. In the first embodiment, the mesa-etching is performed down to the substrate 1 and the selective growth is effected at both sides. In the fourth embodiment, the mesa-etching is stopped at the level of 0.1 μm to 0.3 μm above the lower waveguide 3, and the selective growth is effected at both sides. According to the case of the fourth embodiment, the depth to be etched by RIBE is smaller by 1.8 μm to 2.0 μm than the first embodiment, and therefore, the etching time can be shortened and the resistivity required to resist that acts as a mask can be tolerated.

Further, as compared with the first embodiment, a numeral of aperture (NA) of the lower waveguide 3 is enlarged, and hence, the coupling between an incident light and the lower waveguide 3 is readily achieved. In FIG. 8, the same reference numerals as those in FIGS. 2 and 3 designate the same elements or portions.

Modifications

In the above-discussed embodiments, the structure is described using materials of a 830 nm band, such as AlGaAs/GaAs series, but other materials of other wavelength bands can be used. Particularly, InGaAsP-/InP series of a 1.5 μm wavelength band, which is mainly used in the coherent optical communication, can be also utilized in devices of the present invention.

In the above structures, the grating is formed in the upper waveguide and the laser and photodiode are integrated in the upper waveguide, but it is feasible to form a grating in the lower waveguide and reverse the up and down relation of the structure.

Furthermore, the grating acting as a coupler can be omitted. In this case, the coupling length and the entire device length might be enlarged, but instead, a process of forming a grating is done away with and hence the fabrication of the device can be facilitated.

As described in the foregoing, according to the present invention, optical semiconductor devices such as integrated light detecting devices and the like which satisfy requirements needed in coherent light detection of the coherent optical communication, are made compact in size and highly functional.

Communication networks of star, bus, ring and other types can be built by using devices of the present invention, and specific transmission systems can be attained, which are, for example, wavelength or frequency division multiplexing communication systems, system using a repeater function and systems utilizing the advantage that a light is transmitted without losses.

More in particular, in the present invention, two waveguides are integrated in a vertical direction or a direction of semiconductor layers, and a plane type three dB coupler can be omitted. A signal entering from a transmission line is incident on the lower waveguide and coupled to the upper waveguide as the signal travels a predetermined distance. Since the local oscillation laser, PIN photodiode are integrated in the upper waveguide, a beat signal between the light coupled to the upper waveguide and a local oscillation light is detected by the PIN photodiode and the signal is picked out.

Further, since a vertical type coupler whose coupling condition is controlled in a vertical direction is used, no complicated craft is needed for its fabrication and a desired coupling function can be obtained with an improved yield. When a coarse grating is formed in the upper waveguide, the coupling length of around 500 μm will suffice and thus the device can be made small in size. Losses can be reduced as the device length is small, and waveguide portions can be fabricated with the same materials as the laser or PIN photodiode so that the manufacturing process can be simplified. When the coupling length is set to a proper magnitude, all of a signal light is not taken out by the coupling portion in a node and a portion of light is transmitted through the lower waveguide in this node as it is. Further, the local oscillation laser can be used as a repeater laser that is coupled to the lower waveguide. The signal can be coupled to the upper waveguide or can be transmitted through the lower waveguide as it is, according to circumstances, by controlling a voltage applied to the coupling portion.

Consequently, according to the present invention, the following optical semiconductor devices, such as signal receivers and are so forth, can be provided. They have simple structures, can be fabricated by simple process, are applicable to coherent light detection and highly functional.

While the present invention has been described with respect to what is presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. An optical semiconductor apparatus comprising:
 a substrate;
 a plurality of semiconductor layers formed on said substrate,
 at least an upper waveguide and a lower waveguide fabricated in said semiconductor layers, said upper and lower waveguides being separated from each other in a direction of said semiconductor layers and being coupled to each other to a predetermined coupling degree;
 a semiconductor laser positioned on said substrate so that light emitted therefrom enters one of said upper and lower waveguides;
 a photodetector positioned on said substrate so as to receive light from one of said upper and lower waveguides.

2. An optical semiconductor apparatus according to claim 1, further comprising a grating formed in or in the vicinity of one of said upper and lower waveguides so that the coupling between said upper and lower waveguides has a wavelength-selectivity property.

3. An optical semiconductor apparatus according to claim 2, further comprising means for controlling the wavelength-selectivity so that a selection wavelength of the coupling is changeable.

4. An optical semiconductor apparatus according to claim 1, further comprising means for controlling the degree of coupling.

5. An optical semiconductor apparatus according to claim 1, wherein said semiconductor laser comprises a single-mode tunable laser.

6. An optical semiconductor apparatus according to claim 5, wherein said semiconductor laser comprises a distributed feedback type laser.

7. An optical semiconductor apparatus according to claim 5, wherein said semiconductor laser comprises a distributed Bragg reflection type laser.

8. An optical semiconductor apparatus according to claim 1, further comprising another semiconductor laser, wherein said semiconductor laser and said another semiconductor laser are arranged in parallel.

9. An optical semiconductor apparatus according to claim 1, further comprising a mesa portion of said optical semiconductor apparatus for lateral confinement of said upper and lower waveguides.

10. An optical semiconductor apparatus according to claim 9, wherein said mesa portion is formed by etching both lateral sides of said upper and lower waveguides down to said substrate and burying the etched both sides with a high-resistance material.

11. An optical semiconductor apparatus according to claim 9, wherein said mesa portion is formed by etching both lateral sides of said upper waveguide down to a level slightly above said lower waveguide and burying the etched both sides with a high-resistance material.

12. An optical semiconductor apparatus according to claim 1, wherein said semiconductor laser includes a plurality of electrodes.

13. An optical semiconductor apparatus according to claim 1, wherein said photodetector includes a plurality of electrodes.

14. A method of driving an optical semiconductor apparatus, said method comprising the steps of:
 (a) providing an optical semiconductor apparatus, the semiconductor apparatus comprising:
 a substrate;
 a plurality of semiconductor layers formed on the substrate, at least an upper waveguide and a lower waveguide fabricated in the semiconductor layers, the upper and lower waveguides being separated from each other in a direction of the semiconductor layers and being coupled to each other to a predetermined coupling degree;

a semiconductor laser positioned on said substrate so that light emitted therefrom enters one of the upper and lower waveguides; and a photodetector positioned on said substrate so as to receive light from one of the upper and lower waveguides;

(b) causing light incident on the optical semiconductor apparatus to enter one of the upper and lower waveguides;

(c) causing the semiconductor laser to generate a local oscillation light beam;

(d) coupling the incident light to the local oscillation light beam to a predetermined coupling degree; and (e) performing a heterodyne detection with the photodetector to detect information carried by the incident light.

15. A method of driving an optical semiconductor apparatus, said method comprising the steps of:

(a) providing an optical semiconductor apparatus, the semiconductor apparatus comprising:

a substrate;

a plurality of semiconductor layers formed on the substrate, at least an upper waveguide and a lower waveguide fabricated in the semiconductor layers, the upper and lower waveguides being separated from each other in a direction of the semiconductor layers and being coupled to each other to a predetermined coupling degree;

a semiconductor laser positioned on the substrate so that light emitted therefrom enters one of the upper and lower waveguides; and a photodetector positioned on the substrate so as to receive light from one of the upper and lower waveguides;

(b) causing light incident on the optical semiconductor apparatus to enter one of the upper and lower waveguides;

(c) causing the semiconductor laser to generate a local oscillation light beam;

(d) coupling the incident light to the local oscillation light beam to a predetermined coupling degree; and (e) performing a heterodyne detection with the photodetector while stabilizing one of the oscillation wavelength and the phase of the semiconductor laser by using a signal detected by the photodetector to detect information carried by the incident light.

16. A method of driving an optical semiconductor apparatus, said method comprising the steps of:

(a) providing an optical semiconductor apparatus, the semiconductor apparatus comprising:

a substrate;

a plurality of semiconductor layers formed on the substrate;

at least an upper waveguide and a lower waveguide fabricated in the semiconductor layers, the upper and lower waveguides being separated from each other in a direction of the semiconductor layers and being coupled to each other to a predetermined coupling degree;

a semiconductor laser positioned on the substrate so that light emitted therefrom enters one of the upper and lower waveguides;

a photodetector positioned on said substrate so as to receive light from one of the upper and lower waveguides; and (b) applying a voltage to a portion of the upper and lower waveguides to change a refractive index thereof so that the degree of coupling between the upper and lower waveguides is controlled.

17. A method of driving an optical semiconductor apparatus, said method comprising the steps of:

(a) providing an optical semiconductor apparatus, the semiconductor apparatus comprising:

a substrate;

a plurality of semiconductor layers formed on the substrate;

at least an upper waveguide and a lower waveguide fabricated in the semiconductor layers, the upper and lower waveguides being separated from each other in a direction of the semiconductor layers and being coupled to each other to a predetermined coupling degree;

a semiconductor laser positioned on said substrate so that light emitted therefrom enters one of the upper and lower waveguides;

a photodetector positioned on said substrate so as to receive light from one of the upper and lower waveguides;

a grating formed in or in the vicinity of one of the upper and lower waveguides so that the coupling between the upper and lower waveguides has the property of wavelength-selectivity; and control means for controlling the wavelength-selectivity so that a selection wavelength of the coupling is changeable;

(b) causing light incident on the optical semiconductor apparatus to enter one of the upper and lower waveguides;

(c) causing the semiconductor laser to generate a local oscillation light beam;

(d) adjusting the selection-wavelength to be the wavelength of the incident light with the control means only when the apparatus performs a signal receiving operation;

(e) performing a heterodyne detection with the photodetector to detect information carried by the incident light; and (f) changing the selection-wavelength to deviate from the wavelength of the incident light with the control means when the apparatus does not perform the signal receiving operation.

18. A method of driving an optical semiconductor apparatus, said method comprising the steps of:

(a) providing an optical semiconductor apparatus, said semiconductor apparatus comprising:

a substrate;

a plurality of semiconductor layers formed on the substrate;

at least an upper waveguide and a lower waveguide fabricated in the semiconductor layers, the upper and lower waveguides being separated from each other in a direction of the semiconductor layers and being coupled to each other to a predetermined coupling degree;

a semiconductor laser positioned on said substrate so that light emitted therefrom enters one of the upper and lower waveguides;

a photodetector positioned on said substrate so as to receive light from one of the upper and lower waveguides; and control means for controlling the degree of coupling;

(b) adjusting the degree of coupling to be approximately 100% with said control means when the apparatus does not perform signal receiving; and (c) causing the semiconductor laser to transmit an oscillating laser beam when the apparatus does not perform signal receiving.

19. A method of driving an optical semiconductor apparatus, said method comprising the steps of:

(a) providing an optical semiconductor apparatus, the semiconductor apparatus comprising:

a substrate;

a plurality of semiconductor layers formed on the substrate;

at least an upper waveguide and a lower waveguide fabricated in the semiconductor layers, the upper and lower waveguides being separated from each other in a direction of the semiconductor layers and being coupled to each other to a predetermined coupling degree;

a semiconductor laser positioned on said substrate so that light emitted therefrom enters one of the upper and lower waveguides;

a photodetector positioned on said substrate so as to receive light from one of the upper and lower waveguides;

control means for controlling the degree of coupling;

(b) causing light incident on the optical semiconductor apparatus to enter one of the upper and lower waveguides;

(c) adjusting the degree of coupling to assume a large value with said control means;

(d) performing a heterodyne detection with said photodetector to detect information carried by the incident light;

(e) modulating the output of the semiconductor laser based on the detected information to generate a signal; and (f) causing the signal generated in said modulating step to be transmitted to the exterior of the optical semiconductor apparatus.

20. An optical transmission system comprising:

(a) a transmission line;

(b) a plurality of nodes interconnected by said transmission line, at least one of said nodes containing an optical semiconductor apparatus, said semiconductor apparatus comprising:

a substrate;

a plurality of semiconductor layers formed on said substrate;

at least an upper waveguide and a lower waveguide fabricated in said semiconductor layers, said upper and lower waveguides being separated from each other in a direction of said semiconductor layers and being coupled to each other to a predetermined coupling degree;

a semiconductor laser positioned on said substrate so that light emitted therefrom enters one of said upper and lower waveguides;

a photodetector positioned on said substrate so as to receive light from one of said upper and lower waveguides;

a grating formed in or in the vicinity of one of said upper and lower waveguides so that the coupling between said upper and lower waveguides has the property of wavelength-selectivity; and control means for controlling the wavelength-selectivity so that a selection wavelength of the coupling is changeable, wherein said control means adjusts the selection-wavelength to be the wavelength of light incident on said optical semiconductor apparatus only when said optical semiconductor apparatus performs a signal receiving operation, and wherein said control means adjusts the selection-wavelength to deviate from the wavelength of the incident light when said optical semiconductor apparatus does not perform the signal receiving operation.

21. An optical transmission system comprising:

(a) a transmission line;

(b) a plurality of nodes interconnected by said transmission line, at least one of said nodes containing an optical semiconductor apparatus, said semiconductor apparatus comprising:

a substrate;

a plurality of semiconductor layers formed on said substrate;

at least an upper waveguide and a lower waveguide fabricated in said semiconductor layers, said upper and lower waveguides being separated from each other in a direction of said semiconductor layers and being coupled to each other to a predetermined coupling degree;

a semiconductor laser positioned on said substrate so that light emitted therefrom enters one of said upper and lower waveguides;

a photodetector positioned on said substrate so as to receive light from one of said upper and lower waveguides; and control means for controlling the degree of coupling, wherein the degree of coupling is adjusted to approximately 100% by said control means when said optical semiconductor apparatus does not perform a signal receiving operation and wherein said semiconductor laser oscillates and transmits a laser beam when said optical semiconductor apparatus does not perform the signal receiving operation.

22. An optical transmission system comprising:

(a) a transmission line;

(b) a plurality of nodes interconnected by said transmission line, at least one of said nodes containing an optical semiconductor apparatus, said semiconductor apparatus comprising:

a substrate;

a plurality of semiconductor layers formed on said substrate;

at least an upper waveguide and a lower waveguide fabricated in said semiconductor layers, said upper and lower waveguides being separated from each other in a direction of said semiconductor layers and being coupled to each other to a predetermined coupling degree;

a semiconductor laser positioned on said substrate so that light emitted therefrom enters one of said upper and lower waveguides;

a photodetector positioned on said substrate so as to receive light from one of said upper and lower waveguides; and control means for controlling the degree of coupling, wherein the degree of coupling is adjusted to a large value by said control means, wherein a heterodyne detection is performed by said photodetector to detect information carried by light incident on said optical semiconductor device and wherein light emitted from said semiconductor laser is modulated based on the detected information to generate a signal which is to be transmitted to the exterior of said optical semiconductor apparatus.

* * * * *

UNITED STATES PATENT AND TRADEMARK OFFICE
CERTIFICATE OF CORRECTION

PATENT NO. : 5,349,598
DATED : September 20, 1994
INVENTOR(S) : OUCHI ET AL.

It is certified that error appears in the above-indentified patent and that said Letters Patent is hereby corrected as shown below:

COLUMN 5:

Line 55, "0 V," should read --0V,--.
    Line 56, "5.0 V." should read --5.0V.--.

COLUMN 6:

Line 47, "influences" should read --influence--.

COLUMN 9:

Line 56, "are" should be deleted.
    Line 58, "and" should read --and are--.

COLUMN 10:

Line 12, "waveguides;" should read --waveguides; and--.

Signed and Sealed this

Fourteenth Day of February, 1995

Attest:

BRUCE LEHMAN

*Attesting Officer*      *Commissioner of Patents and Trademarks*